(12) United States Patent
Maki

(10) Patent No.: US 9,905,545 B2
(45) Date of Patent: Feb. 27, 2018

(54) LIGHT EMITTING DEVICE

(71) Applicant: TOSHIBA HOKUTO ELECTRONICS CORPORATION, Asahikawa-Shi (JP)

(72) Inventor: Keiichi Maki, Asahikawa (JP)

(73) Assignee: Toshiba Hokuto Electronics Corporation, Asahikawa-Shi (JP)

( * ) Notice: Subject to any disclaimer, the term of this patent is extended or adjusted under 35 U.S.C. 154(b) by 0 days.

(21) Appl. No.: 15/267,775

(22) Filed: Sep. 16, 2016

(65) Prior Publication Data
US 2017/0005078 A1 Jan. 5, 2017

Related U.S. Application Data

(63) Continuation of application No. PCT/JP2015/001600, filed on Mar. 23, 2015.

(30) Foreign Application Priority Data

Mar. 25, 2014 (JP) .................. 2014-061993

(51) Int. Cl.
*H01L 25/07* (2006.01)
*H01L 33/52* (2010.01)
(Continued)

(52) U.S. Cl.
CPC ...... *H01L 25/0756* (2013.01); *H01L 25/0753* (2013.01); *H01L 33/38* (2013.01);
(Continued)

(58) Field of Classification Search
CPC . H01L 25/0756; H01L 25/0753; H01L 33/38; H01L 33/52; H01L 33/58; H01L 33/62
See application file for complete search history.

(56) References Cited

U.S. PATENT DOCUMENTS 7,952,107 B2 5/2011 Daniels et al.
8,044,415 B2 10/2011 Messere et al.
(Continued)

FOREIGN PATENT DOCUMENTS

JP 60-262430 A1 12/1985
JP 61-006833 A1 1/1986
(Continued)

OTHER PUBLICATIONS

U.S. Appl. No. 15/078,321, filed Mar. 23, 2016, Maki, Keiichi.
(Continued)

*Primary Examiner* — Christine Enad
(74) *Attorney, Agent, or Firm* — Burr & Brown, PLLC

(57) ABSTRACT

A light emitting device includes a base with a light transmissivity, a first light emitting element which has an electrode formed on only one surface, the electrode being connected to a conductor layer formed on the base, a second light emitting element which has an electrode formed on only one surface, the electrode being connected to the conductor layer formed on the base, and which emits light with a different color from a color of light emitted from the first light emitting element, and a resin layer that holds the first and second light emitting elements against the base.

13 Claims, 8 Drawing Sheets

(51) Int. Cl.
  *H01L 33/62* (2010.01)
  *H01L 25/075* (2006.01)
  *H01L 33/38* (2010.01)
  *H01L 33/58* (2010.01)

(52) U.S. Cl.
  CPC .............. *H01L 33/52* (2013.01); *H01L 33/58* (2013.01); *H01L 33/62* (2013.01); *H01L 2924/0002* (2013.01)

(56) References Cited

U.S. PATENT DOCUMENTS

| | | |
|---|---|---|
| 9,306,132 B2 | 4/2016 | Maki |
| 2009/0114928 A1 | 5/2009 | Messere et al. |
| 2013/0221278 A1* | 8/2013 | Inoue .................. C07F 15/0033 252/301.16 |
| 2013/0285077 A1* | 10/2013 | Kojima ............... H01L 25/0753 257/88 |
| 2015/0008396 A1* | 1/2015 | Naijo .................. H01L 51/0097 257/40 |
| 2016/0013376 A1 | 1/2016 | Maki |
| 2016/0027973 A1 | 1/2016 | Maki |
| 2016/0155913 A1 | 6/2016 | Maki |
| 2016/0172343 A1* | 6/2016 | Hsu ...................... G02B 6/0031 257/89 |
| 2016/0233399 A1 | 8/2016 | Maki |

FOREIGN PATENT DOCUMENTS

| | | |
|---|---|---|
| JP | 61-194732 A1 | 8/1986 |
| JP | 11-145381 A1 | 5/1999 |
| JP | 11-177147 A1 | 7/1999 |
| JP | 2000-227952 A1 | 8/2000 |
| JP | 2000-299411 A1 | 10/2000 |
| JP | 2002-246418 A1 | 8/2002 |
| JP | 2006-319149 A1 | 11/2006 |
| JP | 2009-512977 A1 | 3/2009 |
| JP | 2012-084855 A1 | 4/2012 |
| JP | 2014-033133 A1 | 2/2014 |
| JP | 5533183 B2 | 6/2014 |
| WO | 2005/099310 A2 | 10/2005 |
| WO | 2007/149362 A2 | 12/2007 |
| WO | 2008/051596 A2 | 5/2008 |
| WO | 2014/156159 A1 | 10/2014 |
| WO | 2014/157455 A1 | 10/2014 |
| WO | 2015/068344 A1 | 5/2015 |
| WO | 2015/083364 A1 | 6/2015 |
| WO | 2015/083365 A1 | 6/2015 |
| WO | 2015/083366 A1 | 6/2015 |

OTHER PUBLICATIONS

U.S. Appl. No. 15/077,143, filed Mar. 22, 2016, Maki, Keiichi.
U.S. Appl. No. 15/078,404, filed Mar. 23, 2016, Maki, Keiichi.
International Search Report and Written Opinion (Application No. PCT/JP2015/001600) dated Jun. 16, 2015.

* cited by examiner

LIGHT EMITTING DEVICE

CROSS-REFERENCE TO RELATED APPLICATION

This application is a continuation of prior International Application No. PCT/JP2015/001600 filed on Mar. 23, 2015, which is based upon and claims the benefit of priority from Japanese Patent Application No. 2014-061993 filed on Mar. 25, 2014, the entire contents of which are incorporated herein by reference.

FIELD OF THE INVENTION

Embodiments of the present disclosure relate to a light emitting device.

SUMMARY OF THE INVENTION

Light emitting devices including a Light Emitting Diodes (LED) are broadly applied for indoor, outdoor, stationary and mobile display devices, and optical devices, such as an indicator lamp, various switches, a signaling device, and a general lighting apparatus.

Display devices that display character strings, geometric figures, and patterns using LEDs are known. Such display devices utilize a full-color LED unit that emits light with various colors by, for example, color mixing of RGB three primary color lights.

General full-color LED units are built with, in a package, chips that emit Red (R), Green (G), and Blue (B) lights. Full-color LED units emit lights that are visible in various colors, such as a white color and an intermediate color, based on the ratio of the light intensity emitted from each chip.

In order to cause full-color LED units to emit light with a desired color other than the RGB, it is necessary to adjust the balance among the light emission intensities of the respective chips. Hence, according to full-color LED units, emission of light with a desired color is relatively difficult, and thus accomplishment of an excellent color rendering performance is difficult.

DETAILED DESCRIPTION OF THE INVENTION

A light emitting device according to the present disclosure includes:

a base with a light transmissivity;

a first light emitting element which has an electrode formed on only one surface, the electrode being connected to a conductor layer formed on the base;

a second light emitting element which has an electrode formed on only one surface, the electrode being connected to the conductor layer formed on the base, and which emits light with a different color from a color of light emitted from the first light emitting element; and a resin layer that holds the first and second light emitting elements against the base.

First Embodiment

A light emitting device according to a first embodiment will be explained with reference to the figures.

Figure 1:
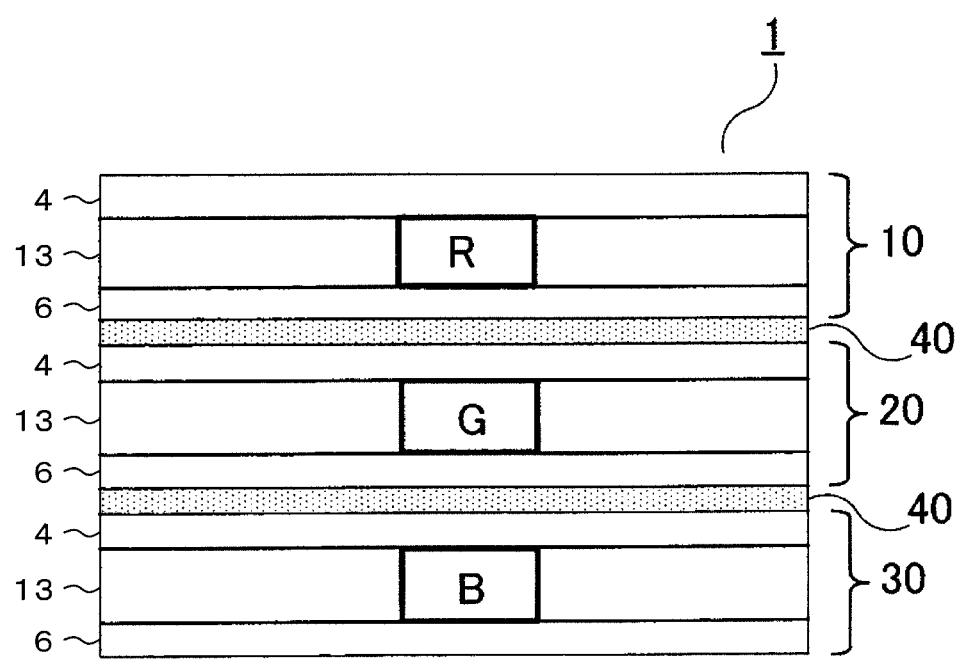
FIG. 1 is an exemplary cross-sectional view illustrating a general structure of a light emitting device according to a first embodiment.

FIG. 1 is a cross-sectional view illustrating a general structure of a light emitting device 1 according to the first embodiment. As illustrated in FIG. 1, the light emitting device 1 includes light emitting units 10, 20, 30 laminated via respective intermediate resins 40. Although it is not illustrated in FIG. 1, the light emitting unit 10 includes light emitting elements 22R that emit red light. The light emitting unit 20 includes light emitting elements 22G that emit green light. The light emitting unit 30 includes light emitting elements 22G that emit blue light (see FIGS. 2, 3A-3B).

Figure 4:
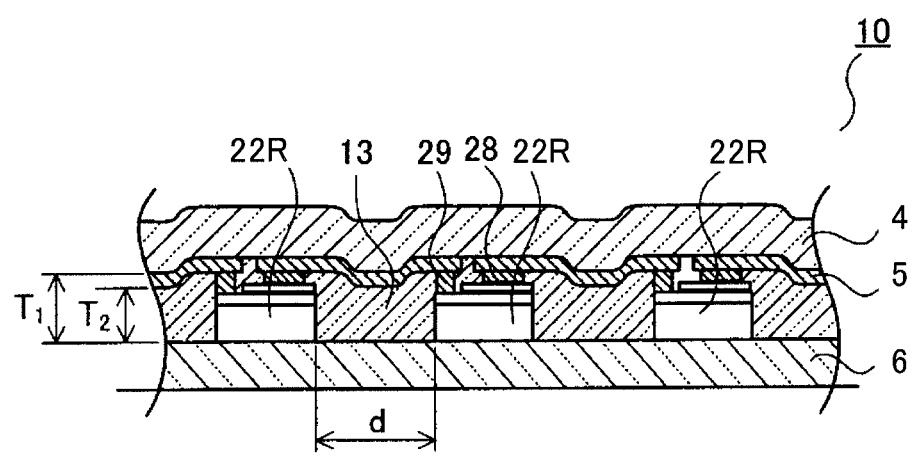
FIG. 4 is a cross-sectional view illustrating a structure of a light emitting unit.
Figure 5:
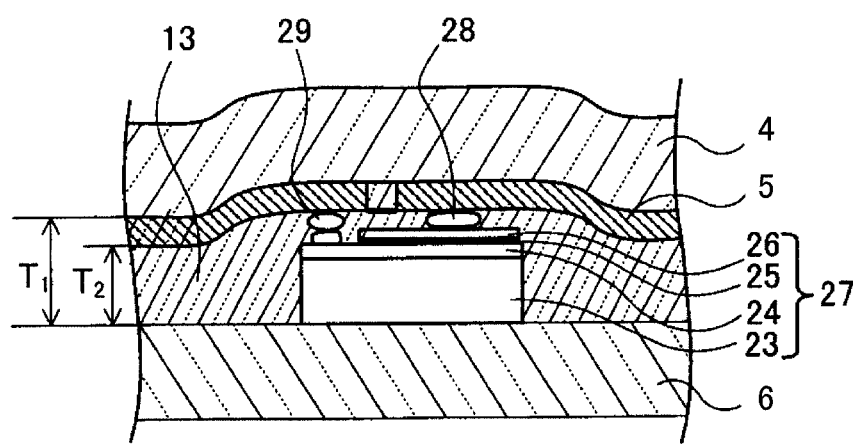
FIG. 5 is a cross-sectional view illustrating a part of the light emitting unit in an enlarged manner.

FIG. 4 is a cross-sectional view illustrating a structure of the light emitting unit 10. In addition, FIG. 5 is a cross-sectional view illustrating a part of the light emitting unit 10 in FIG. 4 in an enlarged manner.

As illustrated in FIG. 4, the light emitting unit 10 includes two support bases 4, 6, the light emitting elements 22R, and an insulation resin 13.

The support base 4 is formed of a resin material in a sheet shape that has, for example, an insulation property, a light transmissive property, and a flexibility. Example resin materials are polyethylene terephthalate (PET), a polyethylene naphthalate (PEN), polycarbonate (PC), polyethylene succinate (PES), a cyclic olefin resin (e.g., ARTON (product name) available from JSR Corporation), and an acrylic resin. It is preferable that the total light transmissibility of the support base 4 should be equal to or higher than 90%, and more preferably, equal to or higher than 95%. Note that the total light transmissibility is defined by, for example, JIS K7105. It is preferable that the thickness of each support base 4, 6 should be within a range of, for example, 50-300 µm. When the support bases 4, 6 are too thick, the flexibility and the light transmissive property may decrease.

Figure 3A:
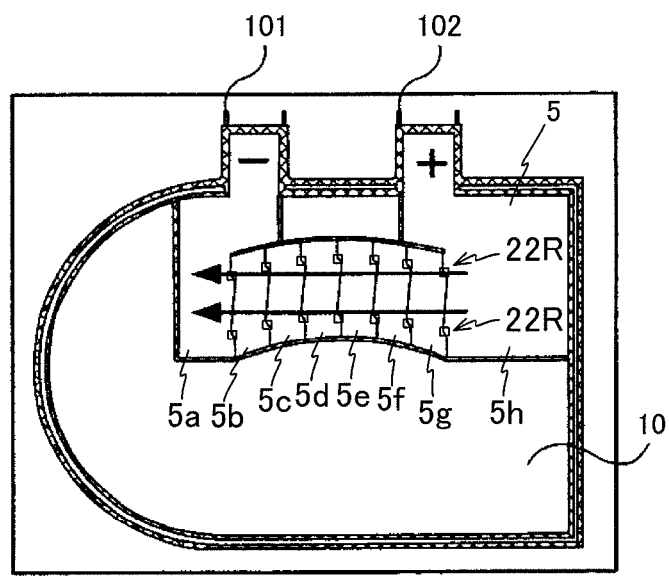
FIG. 3A is a plan view of a first light emitting unit.

A conductive circuitry layer 5 is formed on the lower surface of the support base 4 as a conductor layer. The conductive circuitry layer 5 is, for example, a conductor pattern formed in a mesh shape to enhance the transmissivity, or a transparent conductive material, such as indium tin oxide (ITO), fluorine-doped tin oxide (FTC), zinc oxide, or indium zinc oxide (IZO). It is preferable that the transmissivity of the conductive circuitry layer 5 should be equal to or higher than 90%. As illustrated in FIG. 3A, the conductive circuitry layer 5 includes at least eight patterns 5a-5h insulated from one another.

The conductive circuitry layer 5 can be formed by, for example, forming a thin film through sputtering or electron-beam evaporation, and patterning the thin film through laser processing or etching. It is preferable that the conductive circuitry layer 5 should have the light transmissive property in such a way that the total light transmissibility of the entire light emitting device 1 becomes equal to or higher than 90%.

In addition, the conductive circuitry layer 5 may be formed by, for example, applying a mixture of microparticles of a transparent conductive material which has an average particle size within a range of 10-100 nm with a transparent resin binder in the shape of a circuit through screen printing, etc., or by patterning on the applied film of the mixture through laser processing or photo lithography so as to form a circuit.

As illustrated in FIG. 4, the base support 6 is arranged so as to face the support base 4 via the conductive circuitry layer 5. The support base 6 employs the same structure as that of the support base 4 except that no conductive circuitry layer is formed on the support base 6.

The light emitting element 22R has the front and back surfaces which emit red light. The light emitting element 22R is arranged between the support base 4 and the support base 6. As illustrated in FIG. 5, the light emitting element 22R includes a light-emitting-element main portion 27, and electrodes 28, 29. As illustrated in FIG. 3A, the light emitting unit 10 includes the 14 light emitting elements 22R. In addition, as illustrated in FIG. 4, the light emitting elements 22R are arranged so as to have a distance d between the adjacent light emitting elements 22R which is equal to or smaller than 1500 μm. Note that the number of light emitting elements 22r in the light emitting unit 10 can be designed as appropriate in accordance with the specification (for example, external size, light emitting area) of the light emitting device 1.

As illustrated in FIG. 5, the light-emitting-element main portion 27 includes an insulation substrate 23 that is, for example, a transparent sapphire substrate, N-type semiconductor layer (for example, n-GaN layer) 24, an active layer (for example, InGaN layer) 25, and a P-type semiconductor layer (for example, p-GaN layer) 26 formed on the insulation substrate 23 in this sequence. Note that the arranged positions of the N-type semiconductor layer and the P-type semiconductor layer may be inverted.

Figure 6:
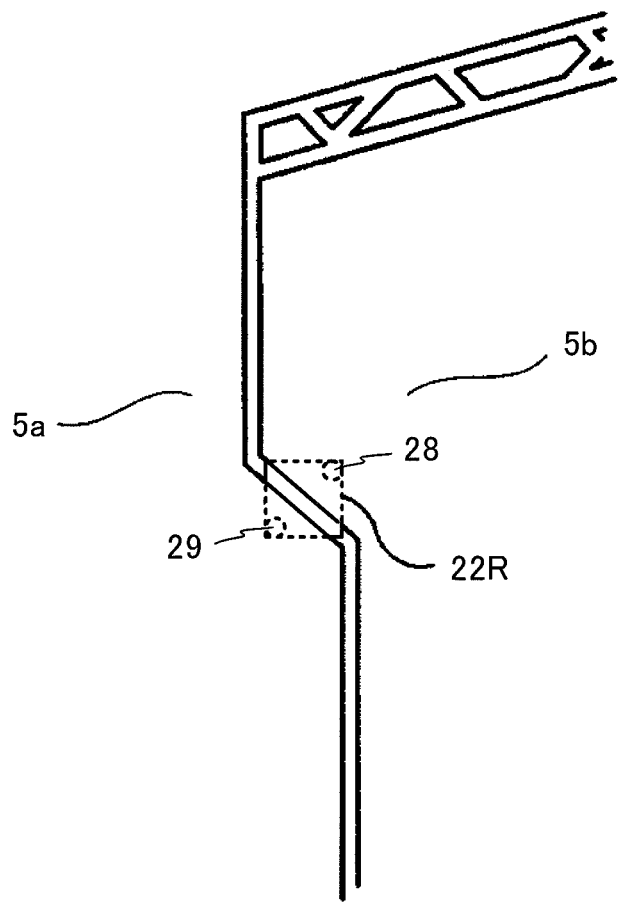
FIG. 6 is a diagram illustrating an arrangement of a light emitting element.

The electrodes 28, 29 are each a pad electrode formed of a material that is an alloy containing gold (Au). The N-type semiconductor layer 24 is connected to the conductive circuitry layer 5 via the electrode 29, while the P-type semiconductor layer 26 is connected to the conductive circuitry layer 5 via the electrode 28. FIG. 6 illustrates an example light emitting element 22R arranged between the pattern 5a and the pattern 5b. As illustrated in FIG. 6, the light emitting element 22R is positioned between the adjacent pattern 5a and pattern 5b, the electrode 29 is connected to the pattern 5a, while the electrode 28 is connected to the pattern 5b.

As illustrated in FIG. 3A, the pair of (two) light emitting elements 22R are arranged between the pattern 5a and the pattern 5b in the above-explained manner. Likewise, respective pairs of light emitting elements 22R are also arranged between the pattern 5b and a pattern 5c, between the pattern 5c and a pattern 5d, between the pattern 5d and a pattern 5e, between the pattern 5e and a pattern 5f, and between the pattern 5f and a pattern 5g, respectively. Hence, according to the light emitting unit 10, the patterns 5a-5h and the seven pairs of light emitting elements 22R are connected in series. In addition, the pair of light emitting elements 22R are connected in parallel.

As illustrated in FIG. 3A, the light emitting unit 10 is provided with terminals 101, 102. The terminal 101 is connected to the pattern 5a that forms the conductive circuitry layer 5. In addition, the terminal 102 is connected to the pattern 5h. Hence, upon application of a DC voltage to the terminals 101, 102, the seven pairs of light emitting elements 22R connected in series emit light. According to the light emitting unit 10, since the seven pairs of light emitting elements 22R are connected in series, the current flowing through the pair of light emitting elements 22R becomes substantially equal. This causes the respective light emission intensities of the 14 light emitting elements 22R to be substantially equal.

As illustrated in FIG. 4, the insulation resin 13 is filled in a space between the support base 4 and the support base 6. It is preferable that the insulation resin 13 should be formed of a material mainly containing elastomer. In addition, other resin components may be contained as needed. Example known elastomers are acrylic-based elastomer, olefin-based elastomer, styrene-based elastomer, ester-based elastomer, and urethane-based elastomer. Among those elastomers, the acrylic-based elastomer that satisfies the above-explained characteristics is a suitable material for the insulation resin 13 since such elastomer has excellent fluidity when softened, adhesion property after cured, and weather resistance, and the like in addition to the light transmissive property, the electrical insulation property, and the flexibility.

It is preferable that the insulation resin 13 should be formed of a light transmissive insulation resin, in particular, elastomer that satisfies predetermined characteristics, such as a Vicat softening temperature, a tensile storage elastic modulus, and a melting-point temperature.

The insulation resin 13 is also filled around the electrodes 28, 29, more specifically, in a space between the conductive circuitry layer 5 and the N-type semiconductor layer 24, and in a space between the conductive circuitry layer 5 and the P-type semiconductor layer 26.

As illustrated in FIG. 5, the thickness of the insulation resin 13 is equal to or lower than a height $T_1$ including the light-emitting-element main portion 27, and the electrodes 28, 29. The insulation resin 13 and the support base 4 are formed in a shape concaved downwardly at a location between the light emitting elements 22R. Hence, the support base 4 pushes down the conductive circuitry layer 5 against the electrodes 28, 29 of the light emitting element 22R. This enhances the electrical connection between the conductive circuitry layer 5 and the electrodes 28, 29 of the light emitting element 22R, and the reliability of such an electrical connection.

Figure 3B:
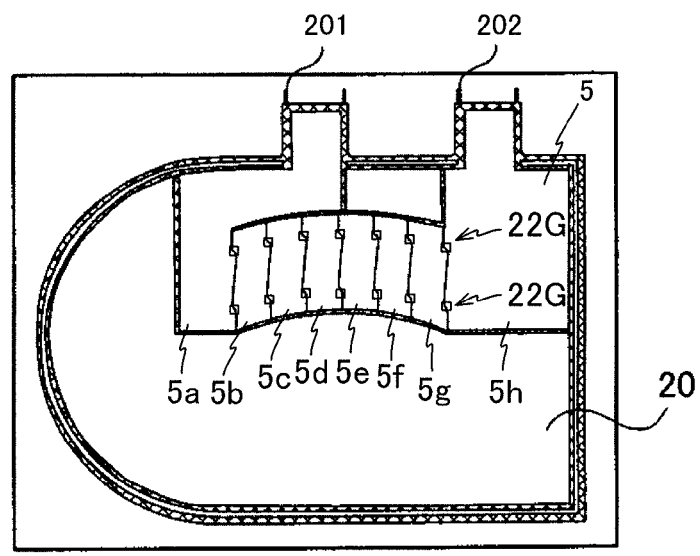
FIG. 3B is a plan view of a second light emitting unit.

FIG. 3B is a plan view of the light emitting unit 20. As illustrated in FIG. 3B, like the light emitting unit 10, the light emitting unit 20 includes the conductive circuitry layer 5 including the patterns 5a-5h, the 14 light emitting elements 22G that have front and back surfaces which emit green light, and terminals 201, 202 connected to the patterns 5a, 5h of the conductive circuitry layer 5, respectively.

Figure 3C:
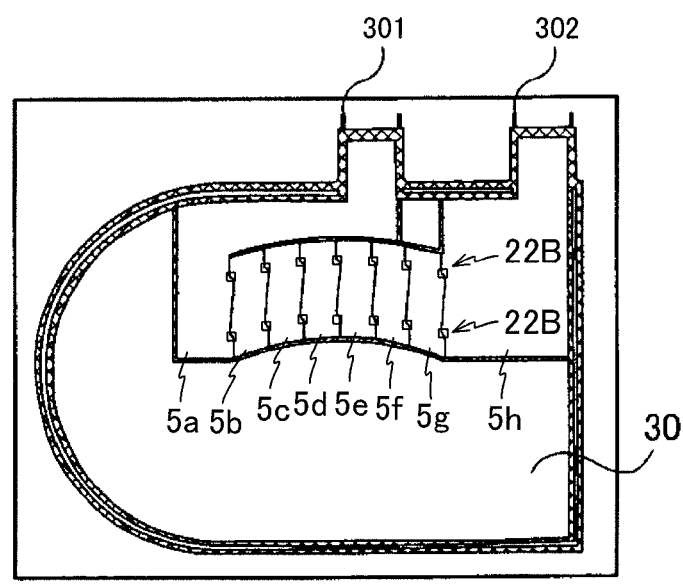
FIG. 3C is a plan view of a third light emitting unit.

FIG. 3C is a plan view of the light emitting unit 30. As illustrated in FIG. 3C, like the light emitting units 10, 20, the light emitting unit 30 includes the conductive circuitry layer 5 including the patterns 5a-5h, the 14 light emitting elements 22B that have front and back surfaces which emit blue light, and terminals 301, 302 connected to the patterns 5a, 5h of the conductive circuitry layer 5, respectively.

For example, the light emitting element 22R of the light emitting unit 10 has the peak wavelength of the relative light intensity which is between 600-700 nm under an environment at 20° C. and at the DC lighting forward current of 20 mA, and emits red light. The light emitting element 22G of the light emitting unit 20 has the peak wavelength of the relative light intensity which is between 500-550 nm under an environment at 20° C. and at the DC lighting forward current of 20 mA, and emits green light. The light emitting element 22B of the light emitting unit 30 has the peak wavelength of the relative light intensity which is between 450-500 nm under an environment at 20° C. and at the DC lighting forward current of 20 mA, and emits blue light.

Figure 2:
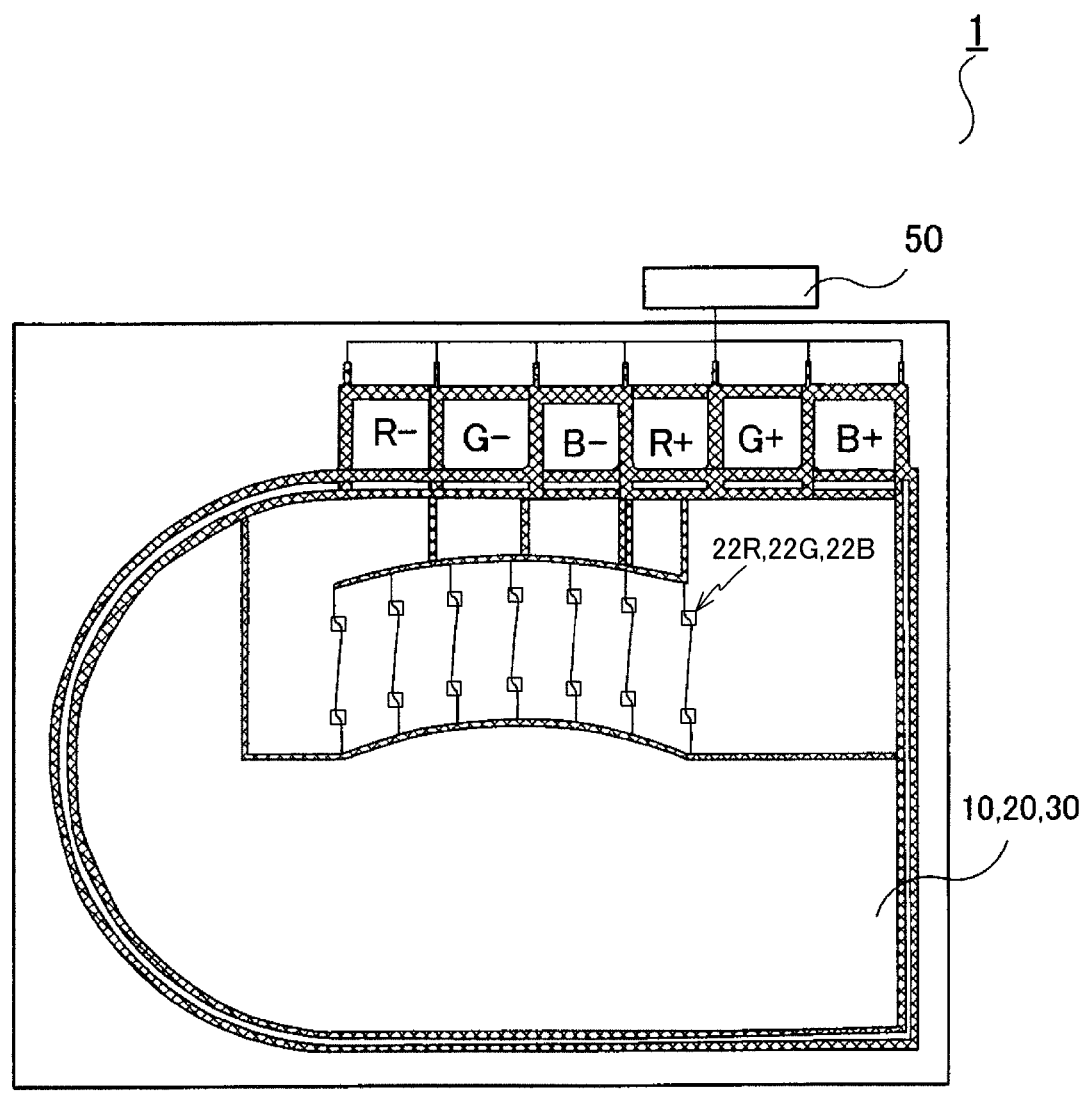
FIG. 2 is a plan view of the light emitting device according to the first embodiment.

As illustrated in FIG. 1, the light emitting device 1 is formed by laminating the light emitting unit 10, the light emitting unit 20, and the light emitting unit 30 via the respective intermediate resins 40. As illustrated in FIG. 2, when the light emitting units 10-30 are laminated, the light emitting element 22R of the light emitting unit 10, the light emitting element 22G of the light emitting unit 20, and the light emitting element 22B of the light emitting unit 30 overlap with each other. In contrast, the respective terminals 101, 102, 201, 202, 301, 302 of the light emitting units 10-30 do not overlap and are shifted at offset locations with each other.

The intermediate resin 40 is a thermoplastic transparent insulation material, and is filled between the light emitting unit 10 and the light emitting unit 20, and between the light emitting unit 20 and the light emitting unit 30.

As for the intermediate resin 40, in order to make the light emitting units 10-30 flexible, for example, a resin material in a sheet shape which has the insulation property, the light transmissive property, and the flexibility is applied. Example resin materials are polyethylene terephthalate (PET), a polyethylene naphthalate (PEN), polycarbonate (PC), polyethylene succinate (PES), a cyclic olefin resin (e.g., ARTON (product name) available from JSR Corporation), and an acrylic resin. It is preferable that the total light transmissibility of the intermediate resin 40 should be equal to or higher than 90%, and more preferably, equal to or higher than 95%.

It is preferable that the thickness of the intermediate resin 40 should be within a range of, for example, 50-300 μm. When the intermediate resin 40 is too thick, the flexibility and the light transmissive property of the light emitting unit may decrease.

The terminals 101, 102, 201, 202, 301, 302 of the light emitting units 10-30 are connected to a control device 50.

Figure 7A:
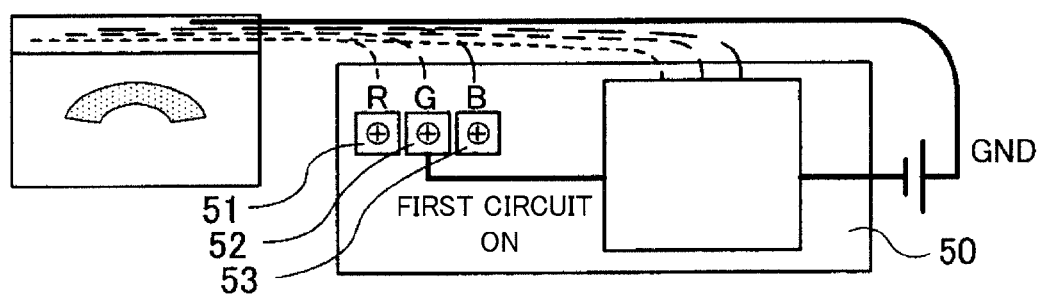
FIG. 7A is a diagram illustrating an example control by a control device.
Figure 7B:
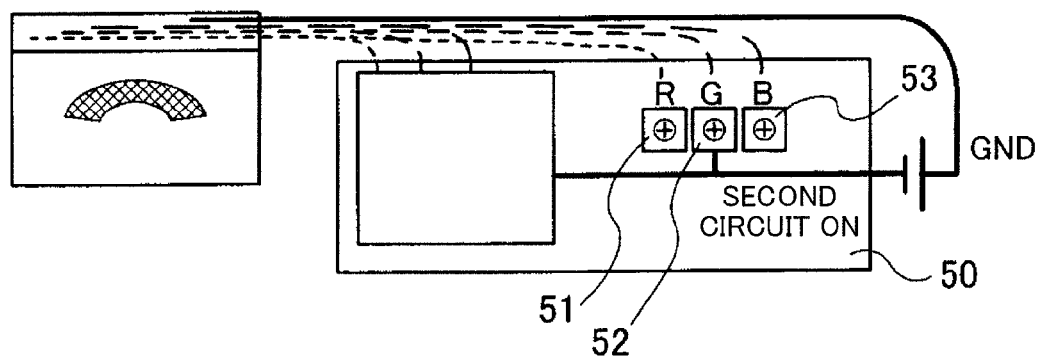
FIG. 7B is a diagram illustrating an example control by the control device.

The control device 50 adjusts the luminosities of the respective light emitting units 10-30, i.e., respective light emissions. FIGS. 7A, 7B are each a diagram illustrating an example control by the control device 50. The control device 50 includes, for example, trimmer capacitors 51, 52, 53 corresponding to the light emitting units 10, 20, 30, respectively. The trimmer capacitors 51, 52, 53 adjust the voltages to be applied to the light emitting units 10, 20, 30, respectively, and thus the luminosities of the respective light emitting units 10-30 change. For example, according to the control illustrated in FIG. 7A, the light emitting device is controlled so as to become brighter step by step. Conversely, according to the control illustrated in FIG. 7B, the light emitting device is controlled so as to become darker step by step.

As explained above, the light emitting device 1 according to the embodiment illustrated in FIG. 1 includes the three light emitting units 10, 20, 30 overlapping with each other. In addition, as illustrated in FIG. 2, the light emitting element 22R of the light emitting unit 10, the light emitting element 22G of the light emitting unit 20, and the light emitting unit 22B of the light emitting unit 30 overlap with each other. This causes lights emitted from the respective light emitting elements 22R, 22G, 22B to be efficiently mixed. Hence, the light emitting device 1 is capable of emitting light with colors other than Red (R), Green (G), and Blue (B), such as a white color and an intermediate color, with an excellent color rendering performance.

The light emitting elements 22R, 22G, 22B according to this embodiment respectively have the electrodes 28, 29 formed on only the respective one surfaces. Hence, the conductive circuitry layer 5 may be provided at only the respective one-surface sides of the light emitting elements 22R, 22G, 22B. Accordingly, in comparison with a case in which the conductive circuitry layer 5 is provided on the respective both-surface sides of the light emitting elements 22R, 22G, 22B, the respective transmissivity of the light emitting units 10-30 are enhanced, and thus the transmissivity of the light emitting device 1 is enhanced.

According to the light emitting device 1 of this embodiment, the luminosity is adjustable individually for each light emitting unit 10-30. This enables the light emitting device 1 to emit light with a desired color.

Note that it is preferable that surfaces of the support bases 4, 6 should be flat. This improves the respective flexibilities of the light emitting units 10-30, and thus the flexibility of the light emitting device 1.

Second Embodiment

Figure 8:
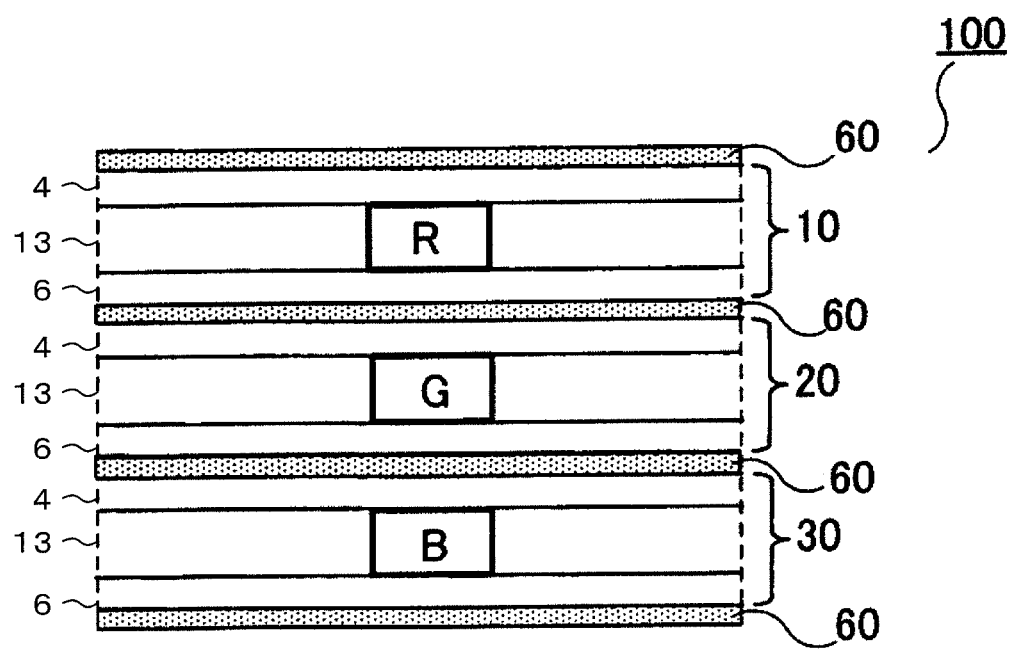
FIG. 8 is an exemplary cross-sectional view illustrating a general structure of a light emitting device according to a second embodiment.

Next, an explanation will be given of a light emitting device 100 according to a second embodiment. FIG. 8 is a cross-sectional view illustrating the major part of the light emitting device 100 according to the second embodiment.

According to the light emitting device 1 of the first embodiment, all components are transparent. When, however, lights emitted from the respective light emitting units 10-30 do not diffuse properly, and when such a diffusion has a variability, the color mixing of the respective colors that are R, G, B is not performed well since lights are guided in the lateral direction. Hence, as illustrated in FIG. 8, the light emitting device of the second embodiment includes a diffuser 60 instead of the intermediate resin 40 in the structure of the light emitting device 1 according to the first embodiment.

The respective diffusers 60 are arranged on the upper surface of the light emitting unit 10, between the light emitting unit 10 and the light emitting unit 20, between the light emitting unit 20 and the light emitting unit 30, and on the lower surface of the light emitting unit 30.

Example diffusers 60 are semi-transparent tape and paper. The diffuser 60 is pasted on the light emitting unit by, for example, adhesive.

According to the second embodiment, since lights emitted from the respective light emitting units 10-30 are diffused, the color mixing of the respective colors that are R, G, B is prompted.

Although the embodiments of the present disclosure have been explained, the present disclosure is not limited to the above embodiments. For example, in the above embodiments, the explanation has been given of an example case in which the respective light emitting elements 22R, 22G, 22B of the light emitting units 10-30 overlap completely. However, as long as the light emitting elements 22R, 22G, 22B are arranged adjacent to each other or arranged so as to at least partially overlap with each other.

In short, when the sizes of the light emitting elements 22R, 22G, 22B for the light emitting device 1 are smaller than the minimum separable acuity of a human eye, it is appropriate that the light emitting elements 22R, 22G, 22B are arranged adjacent to each other or so as to at least partially overlap as long as those light emitting elements are recognizable as the consistent light source.

In the above embodiments, the explanation has been given of an example case in which the light emitting device 1 includes the light emitting units 10, 20, 30, each including the pair of support bases 4, 6. However, the light emitting device 1 may include, for example, a support base 4, the light emitting elements 22R, 22G, 22B connected to the conductive circuitry layer 5 formed on the support base 4, and the insulation resin 13 that holds the light emitting elements 22R, 22G, 22B relative to the support base 4.

In addition, the light emitting device 1 may include the two support bases 4, 6, the light emitting elements 22R, 22G, 22B connected to the conductive circuitry layer 5 formed on the support base 4, and the insulation resin 13 which is filled between the two support bases 4, 6, and which holds the light emitting elements 22R, 22G, 22B relative to the support bases 4, 6.

In the above embodiments, the explanation has been given of an example case in which the light emitting device 1 includes the light emitting elements that emit Red (R), Green (G), Blue (B) lights. However, the light emitting device may include at least two types of light emitting elements that emit different color lights.

In the above embodiments, as illustrated in FIG. 1, the three light emitting units 10, 20, 30 have the support base 6 of the light emitting unit 10 bonded to the support base 4 of the light emitting unit 20, and have the support base 6 of the light emitting unit 20 bonded to the support base 4 of the light emitting unit 30, and thus those light emitting units are integrated one another. However, a single support base may form the support base 6 of the light emitting unit 10 and also the support base 4 of the light emitting unit 20. Likewise, a single support base may form the support base 6 of the light emitting unit 20 and also the support base 4 of the light emitting unit 30.

According to the light emitting device 1 of the above embodiment, as illustrated in FIG. 1, the light emitting unit 10 is arranged on the top, the light emitting unit 20 is arranged under the light emitting unit 10, and the light emitting unit 30 is arranged below the light emitting unit 20. However, the arrangement sequence of the light emitting units 10-30 can be changed as appropriate. In addition, the light emitting device 1 may include any two light emitting units among those three light emitting units 10-30. Still further, the light emitting device 1 may include equal to or greater than four light emitting units.

In the above second embodiment, the diffuser 60 is provided on the surface of the light emitting unit. Diffusers in various forms are also applicable. For example, a microparticle filler may be mixed in the insulation resin 13 of the light emitting unit 10, 20, 30 to obtain an opaque resin, and this may be utilized as the diffuser.

In addition, the microparticle filler may be mixed in the intermediate resin 40 to obtain an opaque resin, and the same opaque resin may be applied to the upper surface of the light emitting unit 10 and the lower surface of the light emitting unit 30, and those opaque resins may be utilized as the diffusers.

Still further, vinyl chloride, etc., which has the transmissivity of 10-90%, and which has the haze value of 10-90% may be applied as the diffuser 60.

Yet still further, the support bases 4, 6 of the light emitting units 10, 20, 30 may also function as the diffusers 60. More specifically, the surfaces of the support bases 4, 6 may be made uneven so as to accomplish the transmissivity of 10-90%, and the haze value of 10-90%. Moreover, the support bases 4, 6, each may be formed of vinyl chloride which has the transmissivity of 10-90%, and which has the haze value of 10-90%. In addition, linear or grid-like blemishes may be simply made in the respective surfaces of the support bases 4, 6.

Furthermore, additional diffusion members may be pasted on both surfaces of the light emitting device 1.

Although several embodiments of the present disclosure have been explained, those embodiments are merely presented as examples, and are not intended to limit the scope of the present disclosure. Those novel embodiments can be carried out in other various forms, and various omissions, replacements, and modifications can be made thereto without departing from the scope of the present disclosure. Such embodiments and modified forms thereof are within the scope and spirit of the present disclosure, and are also within the scope of the invention as recited in the appended claims and the equivalent range thereto.

The invention claimed is:

1. A light emitting device comprising:
a first light emitting element comprising a first electrode formed on one surface for power supply, and emitting a first color light;
a first upper base which has a light transmissivity, comprises a first conductor layer electrically connected to the first electrode, and formed in a curved shape along the first light emitting element;
a first insulation resin layer that holds the first light emitting element against the first upper base;
a first lower base which is substantially flat, supports the first insulation resin layer and the first light emitting element, and has a light transmissivity;
a second light emitting element comprising a second electrode formed on one surface for power supply, emitting a second color light, and arranged in a manner overlapping the first light emitting element;
a second upper base which has a light transmissivity, comprises a second conductor layer electrically connected to the second electrode, and is formed in curved shape along the second light emitting element;
a second insulation resin layer that holds the second light emitting element against the second upper base;
a second lower base which is substantially flat, supports the second insulation resin layer and the second light emitting element, and has a light transmissivity; and
an intermediate resin layer that is present between the curved second upper base and the flat first lower base.

2. The light emitting device according to claim 1, wherein a luminosity of each of the light emitting elements is individually adjustable.

3. The light emitting device according to claim 1, wherein:
each respective upper base is connected to a plurality of the light emitting elements; and
a distance between adjacent light emitting elements is equal to or less than 1500 μm.

4. The light emitting device according to claim 1, comprising a diffuser that diffuses light from the light emitting elements.

5. The light emitting device according to claim 1, wherein:
a thickness of each respective insulation resin layer is equal to or lower than a thickness of each respective light emitting element including the electrode.

6. The light emitting device according to claim 1, wherein:

the upper bases curve to cover the light emitting elements and push the conductor layers to the electrodes of the light emitting elements.

7. A light emitting device comprising:
a first light emitting element comprising a first electrode formed on one surface for power supply, and emitting a first color light;
a first upper base which has a light transmissivity, comprises a first conductor layer electrically connected to the first electrode, and formed in a curved shape along the first light emitting element;
a first insulation resin layer that holds the first light emitting element against the first upper base;
a first lower base that supports the first insulation resin layer and the first light emitting element, and has a light transmissivity;
a second light emitting element comprising a second electrode formed on one surface for power supply, emitting a second color light, and arranged in a manner overlapping the first light emitting element;
a second upper base which has a light transmissivity, comprises a second conductor layer electrically connected to the second electrode, and is formed in curved shape along the second light emitting element;
a second insulation resin layer that holds the second light emitting element against the second upper base;
a second lower base which supports the second insulation resin layer and the second light emitting element, and has a light transmissivity; and
an intermediate resin layer that is present between the curved second upper base and the first lower base.

8. The light emitting device according to claim 7, wherein a luminosity of each of the light emitting elements is individually adjustable.

9. The light emitting device according to claim 7, wherein:
each respective upper base is connected to a plurality of the light emitting elements; and
a distance between adjacent light emitting elements is equal to or less than 1500 μm.

10. The light emitting device according to claim 7, comprising a diffuser that diffuses light from the light emitting elements.

11. The light emitting device according to claim 7, wherein:
a thickness of each respective insulation resin layer is equal to or lower than a thickness of each respective light emitting element including the electrode.

12. The light emitting device according to claim 7, wherein:
the upper bases curve to cover the light emitting elements and push the conductor layers to the electrodes of the light emitting elements.

13. A light emitting device comprising:
a first light emitting element comprising a first electrode formed on one surface for power supply;
a first upper base which has a light transmissivity, comprises a first conductor layer electrically connected to the first electrode, and formed in a curved shape along the first light emitting element;
a first insulation resin layer that holds the first light emitting element against the first upper base;
a first lower base that supports the first insulation resin layer and the first light emitting element, and has a light transmissivity;
a second light emitting element comprising a second electrode formed on one surface for power supply, and at least arranged in a manner disposed close to the first light emitting element;
a second upper base which has a light transmissivity, comprises a second conductor layer electrically connected to the second electrode, and is formed in curved shape along the second light emitting element;
a second insulation resin layer that holds the second light emitting element against the second upper base;
a second lower base which supports the second insulation resin layer and the second light emitting element, and has a light transmissivity; and
an intermediate resin layer that is present between the curved second upper base and the first lower base.

* * * * *